United States Patent [19]

Uchida

[11] Patent Number: 4,585,955
[45] Date of Patent: Apr. 29, 1986

[54] INTERNALLY REGULATED POWER VOLTAGE CIRCUIT FOR MIS SEMICONDUCTOR INTEGRATED CIRCUIT

[75] Inventor: Yukimasa Uchida, Yokohama, Japan

[73] Assignee: Tokyo Shibaura Denki Kabushiki Kaisha, Kawasaki, Japan

[21] Appl. No.: 556,686

[22] Filed: Nov. 30, 1983

[30] Foreign Application Priority Data

Dec. 15, 1982 [JP] Japan ................................. 57-219617
Dec. 18, 1982 [JP] Japan ................................. 57-222452
Dec. 27, 1982 [JP] Japan ................................. 57-234046

[51] Int. Cl.[4] ........................ G05F 1/575; G05F 3/08; H03K 19/003; H03K 19/094
[52] U.S. Cl. .................... 307/297; 307/200 B; 307/443; 307/475; 323/281; 323/284; 323/317; 323/316; 365/226
[58] Field of Search ................ 307/200 B, 446, 475, 307/297, 443, 200 A; 323/281, 282, 284, 315, 316, 317; 365/226, 228

[56] References Cited

U.S. PATENT DOCUMENTS

| | | | |
|---|---|---|---|
| 3,675,144 | 7/1972 | Zuk ................................. | 307/475 X |
| 3,836,789 | 9/1974 | Struk et al. ..................... | 307/475 |
| 4,075,690 | 2/1978 | Oberman et al. ................ | 307/279 X |
| 4,365,316 | 12/1982 | Iwahashi et al. ................ | 307/475 X |
| 4,430,582 | 2/1984 | Bose et al. ...................... | 307/475 X |
| 4,469,959 | 9/1984 | Luke et al. ...................... | 307/475 X |
| 4,471,242 | 9/1984 | Nouffer et al. .................. | 307/475 |
| 4,472,647 | 9/1984 | Allgood et al. .................. | 307/475 |
| 4,475,050 | 10/1984 | Noufer ............................ | 307/475 |

FOREIGN PATENT DOCUMENTS

063483 10/1982 European Pat. Off. .
23340 2/1979 Japan ................................. 307/475
WO82/04345 12/1982 PCT Int'l Appl. ................ 365/226

OTHER PUBLICATIONS

Patent Abstracts of Japan, vol. 7, No. 233 (E-204) (1378), Oct. 15, 1983 and JP-A-58 121 664 (Nippon Denki K.K.) (7-20-1983).
Dennard et al, "1 μm MOSFET VLSI Technology: Part II"; IEEE-JSSC, vol. SC-14, No. 2, pp. 247-254; 4/1979.
Malaviya, "Regulated On-Chip Reference Generator for Logic Families"; IBM-TDB; vol. 18, No. 5; pp. 1418-1419; 10/1975.
Jaeger, "Regulated Power Supply for MTL Integrated Circuits"; IBM-TDB; vol. 18, No. 4, pp. 1220-1222; 9/1975.

*Primary Examiner*—Larry N. Anagnos
*Attorney, Agent, or Firm*—Finnegan, Henderson, Farabow, Garrett & Dunner

[57] ABSTRACT

A MIS semiconductor integrated circuit is one which contains an internal circuit. In the internal circuit, an externally supplied power source voltage supplied to a power source voltage terminal is supplied to the voltage input terminal of a voltage dropping circuit. The voltage at a voltage output terminal of the voltage dropping circuit is detected by a voltage detecting circuit containing an inverting circuit with a predetermined threshold voltage. The voltage dropping circuit is switch-controlled by applying the detected voltage to the control terminal thereof. The voltage output terminal of the voltage dropping circuit provides an internal power source voltage which is formed by dropping the externally supplied power source voltage. An internal circuit containing MOSFETs with an effective channel length of 1 μm or less is driven by the internal power source voltage.

16 Claims, 17 Drawing Figures

INTERNALLY REGULATED POWER VOLTAGE CIRCUIT FOR MIS SEMICONDUCTOR INTEGRATED CIRCUIT

BACKGROUND OF THE INVENTION

The present invention relates to a MIS semi-conductor integrated circuit containing MISFETs as circuit elements and, more particularly, to a MIS semiconductor integrated circuit containing MISFETs of which the effective channel length is approximately 1 μm or less.

With the substantial progress recently made in the development of semiconductor integrated circuits containing MOSFETs as one type of MISFETs, integrated circuits containing several tens or hundreds of MOSFETs with an effective channel length of about 10 μm per chip were realized in the later half of 1960. The advanced micro-fabrication technique has further improved the integration density of the integrated circuits, thus allowing for the realization of VLSIs containing several hundred thousand elements, with an effective channel length of about 1.5 μm per chip.

Submicron semiconductor integrated circuits having submicron MOSFETs with an effective channel length of 1 μm or less may be realized in near future.

In the conventional MIS semiconductor integrated circuit, the internal circuit is directly driven by a power source voltage which is externally supplied. The value of the power source voltage decreases with the reduction of the effective channel length of the MISFETs (MOSFETs), making up the internal circuit. A 5 V power source voltage is used in driving the internal circuit of semiconductor integrated circuits containing MOSFETs with an effective channel length of, for example, 1.5 μm.

Reduction of the effective channel length of the MOSFET increases the electric field thereof, if the power voltage is fixed. An increase in the electric field of the MOSFET adversely influences its elementary characteristics in the following ways.

1. Hot electrons or hot halls are generated, due to the impact of ionization.
2. The substrate current is increased.
3. The punch-through withstand capacity is reduced.
4. PN contacts containing sources and drains are broken down.
5. The threshold voltage changes over time, due to the trapping of hot carriers within the gate insulation film.

To avoid the above disadvantages, strict requirements are applied in setting the value of the externally applied power source voltage.

In the future, the submicron semiconductor integrated circuit will require a power source with a voltage level lower than that of the 5 V power source voltage, which is currently used as a standard power source, to avoid the above problems (1–5). The aging of the threshold voltage of the MOSFET, which is due to the trapping of hot carriers (See 5, above), may markedly deteriorate the speed performance of the submicron semiconductor integrated circuit, or may cause the imperfect operation of the submicron semiconductor integrated circuit.

Figure 1:
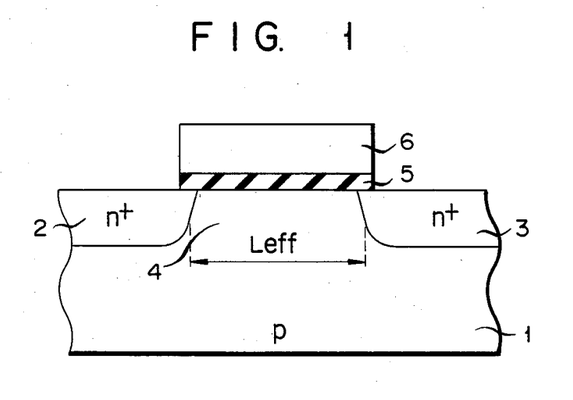
FIG. 1 shows a cross-sectional view of the structure of a general MOSFET.

FIG. 1 shows a cross-section illustrating the structure of a general enhancement type MOSFET. In the figure, reference numeral 1 designates a P type silicon semiconductor substrate. An n+ type source region 2 and an n+ type drain region 3 are diffused into the surface region of the substrate 1. A gate electrode 6 made of polysilicon, for example, is formed above a channel region 4 located between the source and drain regions 2, 3, while overlaying a gate insulating film 5. In FIG. 1, "Leff" indicates the effective channel length of the MOSFET.

Figure 2:
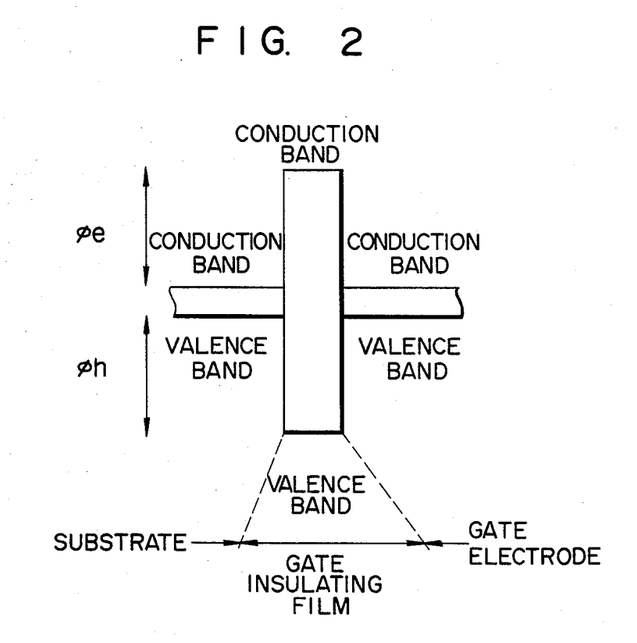
FIG. 2 illustrates an energy band of the MOSFET shown in FIG. 1.

FIG. 2 illustrates an energy band of the MOSFET shown in FIG. 1. A potential barrier $\phi e$ for electrons, which is formed at the boundary between the substrate 1 and the gate insulating film 5, is 3.1 eV; and a potential barrier $\phi h$ for holes is approximately 3.8 eV. Let us assume that the geometry of the MOSFET is further reduced and the effective channel length (Leff) is reduced to 1 μm or less. Under such geometrical conditions, if the power source voltage is kept at 5 V, the probability that hot electrons and holes generated by impact ionization will exceed the above potential barriers $\phi e$, $\phi h$ and enter the gate insulating film 5 is high. These electrons and holes entering the gate insulating film 5, are then trapped by the same film, so that the aging of the threshold voltage is great. In assembling many and various types of semiconductor integrated circuits into a system, it is desirable, for size and cost-reduction purposes, that the semiconductor integrated circuits be operable by a single and common power source. It is also preferable that the submicron semiconductor integrated circuit be operable by a standard power source voltage of 5 V, since it is frequently used in connection with the TTL circuits. In semiconductor integrated circuits of the type in which the internal circuit is directly driven by an external power source, however, use of the 5 V power source voltage is accompanied by a deterioration of the circuits characteristic, as mentioned above, possibly making the elements defective.

Further, in conventional semiconductor integrated circuits, such factors as operating speed and power dissipation depend largely on the externally applied power source voltage. This makes the circuit design complex, so that the semiconductor integrated circuits are not easy to handle in their systems applications.

Additionally, the conventional semiconductor integrated circuit must be operated by using a high precision power source. If it is driven by a poor precision power source, an overvoltage application might cause the internal MOSFETs to be deteriorated, degrading their reliability. Moreover, when a spike voltage or noise appears on the power line, the internal MOSFETs are deteriorated or erroneously operated.

SUMMARY OF THE INVENTION

Accordingly, the primary object of the present invention is to provide a MIS semiconductor integrated circuit in which the internal MISFETs are not deteriorated, ensuring high reliability, even if said circuit is operated against an external power voltage which is substantially varied.

A second object of the present invention is to provide a MIS semiconductor integrated circuit which can sustain a stable performance against an externally supplied power voltage which is substantially varied.

A third object of the present invention is to provide a MIS semiconductor integrated circuit which is stably operable, regardless of the spike voltage or noise appearing on the power line.

According to the present invention, a MIS semiconductor integrated circuit is provided, which comprises: a power source voltage terminal externally supplied with a power source voltage; an internal power source circuit including voltage dropping means having a control terminal, a voltage input terminal, a voltage output terminal, the voltage input terminal being supplied with the voltage at the power source voltage terminal; a detecting means which detects a voltage at the voltage output terminal of the voltage dropping means at a predetermined threshold and supplies the detection signal thereof to the voltage dropping means; and an internal circuit which is operable under the voltage of the internal power source circuit, said internal circuit containing MISFETs with a predetermined effective channel length.

DETAILED DESCRIPTION OF THE PREFERRED EMBODIMENTS

Figure 3:
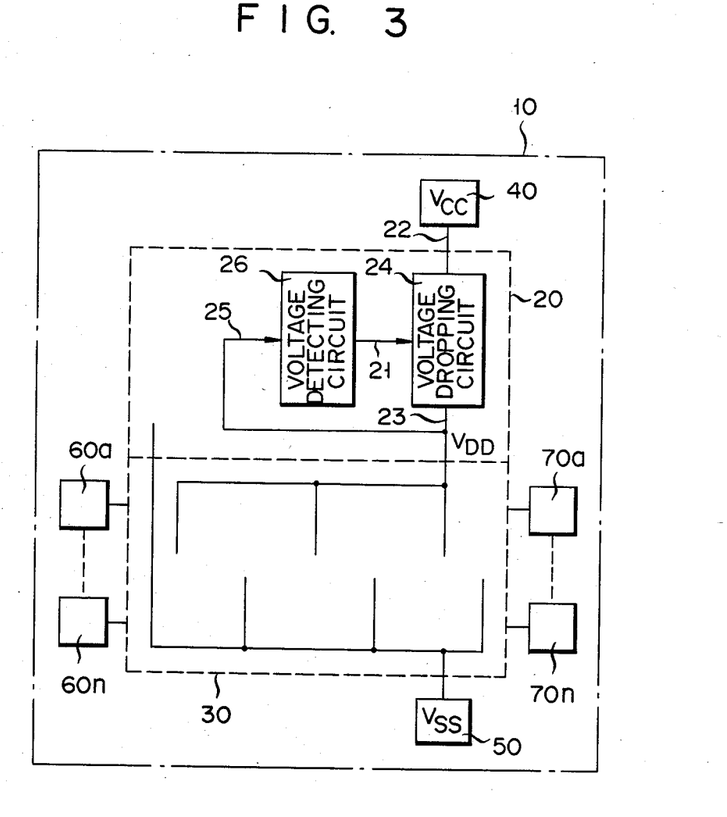
FIG. 3 is a block diagram of a MIS semiconductor integrated circuit according to an embodiment of the present invention.

Various types of preferred embodiments of the present invention may be described with reference to the accompanying drawings. FIG. 3 is a block diagram of a MIS semiconductor integrated circuit according to a preferred embodiment of the present invention. In the MIS semiconductor integrated circuit (10), an internal power source circuit 20, an internal circuit 30 containing MOSFETs with an effective channel length of 1 μm or less, and various terminals (e.g., a power source voltage terminal 40 externally supplied with a positive power source voltage $V_{CC}$, a power source voltage terminal 50 externally supplied with another power source voltage $V_{SS}$ of 0 V, a plurality of input terminals 60a–60n, and a plurality of output terminals 70a–70n) are formed on a semiconductor chip. The internal circuit 30 is driven by the power source voltage $V_{DD}$ supplied from the internal power source circuit 20. The internal circuit 30 may be an overall memory circuit, a portion of the memory circuit, a microprocessor circuit, a digital signal processing circuit, a digital control circuit, a gate array circuit, etc.

The internal power source circuit 20 produces a fixed internal power source voltage $V_{DD}$, using the power source voltage $V_{CC}$ supplied from the power source voltage terminal 40. The internal power source circuit 20 is comprised of a voltage dropping circuit 24 for generating an internal fixed power source voltage $V_{DD}$, by using an externally supplied power voltage $V_{CC}$ supplied to the power source voltage terminal 40, said voltage dropping circuit 24 having a control terminal 21, a voltage output terminal 23, and a voltage input terminal 22 supplied with the voltage $V_{CC}$ from said power source voltage terminal 40; and a voltage detecting circuit 26 which receives at the input terminal 25 the voltage of the voltage output terminal 23 in the voltage dropping circuit 24, detects the voltage $V_{DD}$ at a predetermined threshold, and supplies this detected voltage to the control terminal 21 of the voltage dropping circuit 24.

In the MIS semiconductor integrated circuit thus arranged, the internal power source circuit 20 produces a fixed voltage $V_{DD}$, using the voltage $V_{CC}$ supplied to the power source voltage terminal 40. The voltage $V_{DD}$ so produced is lower than voltage $V_{CC}$, and is used as a power source voltage for the internal circuit 30. To be more specific, the voltage dropping circuit 24 drops the voltage $V_{CC}$ according to the detected output signal from the voltage detecting circuit 26, which appears at the control terminal 21. Through this voltage dropping, voltage $V_{DD}$ is obtained. The voltage detecting circuit 26 detects the dropped voltage $V_{DD}$ by using the predetermined threshold voltage. The detected output of the voltage detecting circuit 26 is directed to the control terminal 21 of the voltage dropping circuit 24, to form a closed loop containing the voltage detecting circuit 26 and the voltage dropping circuit 24. With this re-direction, the voltage $V_{DD}$ at the voltage output terminal 23 of the voltage dropping circuit 24 is so controlled as to be equal to the threshold voltage $V_{TH}$ through the closed loop.

Figure 4:
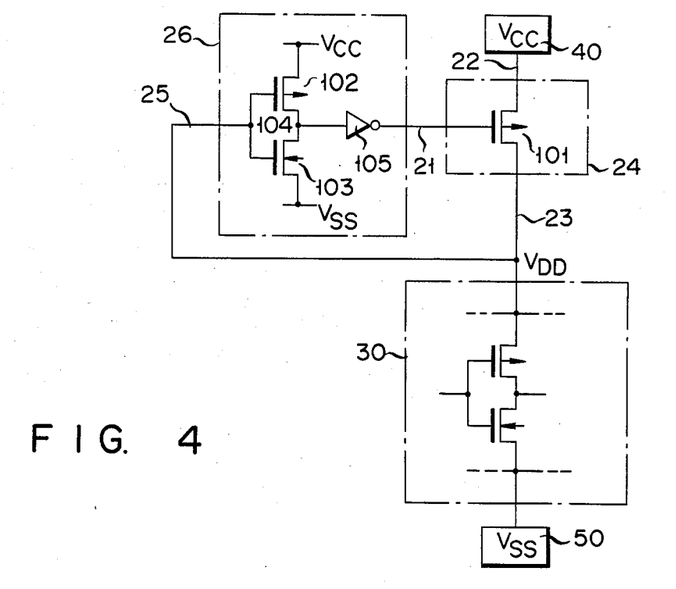
FIG. 4 is a circuit diagram of the circuit of FIG. 3.

FIG. 4 shows a practical arrangement of the functional diagram of FIG. 3. The voltage dropping circuit 24 is comprised of an enhancement type P channel MOSFET 101 of which the gate, source and drain are connected to the control terminal 21, the input terminal 22 and the voltage output terminal 23, respectively. The drain voltage is supplied as the internal power source voltage $V_{DD}$ to the internal circuit 30, and to the input terminal 25 of the voltage detecting circuit 26. The voltage detecting circuit 26 is comprised of a couple of CMOS inverters 104 and 105, which are connected in a cascade fashion. The CMOS inverter 104 includes a P channel MOSFET 102 and an N channel MOSFET 103 supplied with the voltage $V_{DD}$. The CMOS inverter 105 has a similar construction to that of the inverter 104. The threshold voltage $V_{TH}$ of the voltage detecting circuit 26 is determined depending on the threshold voltage of two MOSFETs 102 and 103 and a ratio of the conductance of each of the two MOSFETs 102 and 103 which make up the prestage CMOS inverter 104. The threshold voltage $V_{TH}$ of the voltage detecting circuit 26 is set at a level below the magnitude ($\phi h \delta 3.8$ eV) of the potential barrier shown in FIG. 2. In FIG. 4, the internal circuit 30 illustrated contains only a CMOS inverter, for the sake of simplicity.

With such an arrangement, if the internal power source voltage $V_{DD}$ is lower than the threshold voltage $V_{TH}$ of the voltage detecting circuit 26, the output of the prestage CMOS inverter 104 in the voltage detecting circuit 26 is at a high level ($V_{CC}$ level). Therefore, since the output of the poststage CMOS inverter 105 is at a low level ($V_{SS}$), the detected output of the voltage detecting circuit 26 is also at a low level. Under such conditions the P channel MOSFET 101 is turned on. Upon the turning on of the MOSFET 101, a parasitic capacitor which is parasitic with respect to the power line for voltage $V_{DD}$ is charged by voltage $V_{CC}$, so that voltage $V_{DD}$ gradually increases. When voltage $V_{DD}$ exceeds the threshold voltage of the voltage detecting circuit 26, the output voltage of the CMOS inverter 104 which has been at a high level is so inverted as to be at a low level. Successively, the output of the CMOS inverter 105 is inverted from the low to the high level. As a result, the detected output of the voltage detecting circuit 26 attains a high level. Then, the P channel MOSFET 101 is cut off. Upon the cut-off of the MOSFET 101, the parasitic capacitor is discharged through the internal circuit 30, and voltage $V_{DD}$ gradually drops. In this way, the P channel MOSFET 101 performs a switching operation to make the internal power source voltage $V_{DD}$ equal to the threshold voltage $V_{TH}$. In this case, if the mutual conductance, which depends upon the ratio of the channel width (W) to the channel length (L), W/L, of the P channel MOSFET 101 for voltage dropping, is set at a high level, the internal power source voltage obtained is large and stable. Moreover, the time constant, as determined by the mutual conductance and the parasitic capacitance, is small at the point of charge by the voltage $V_{DD}$. Therefore, the response is quickened at the time of setting the voltage $V_{DD}$. Thus, the internal power source voltage $V_{DD}$ is invariable even when the externally supplied power source voltage $V_{CC}$ changes in a wide range of 3 to 8 V. In this embodiment, the fixed voltage $V_{DD}$, or the internal power source voltage, which is formed by dropping the externally supplied power source voltage $V_{CC}$, is 3 V. Our experiment confirmed that the internal power source voltage $V_{DD}$ keeps its constancy against a variation of the externally supplied power source voltage $V_{CC}$, and a spike voltage and noise, which appear on the power line. Therefore, the internal circuit 30 driven by the internal power source voltage $V_{DD}$ is perfectly protected from a high voltage, ensuring high reliability in operation.

Figure 5:
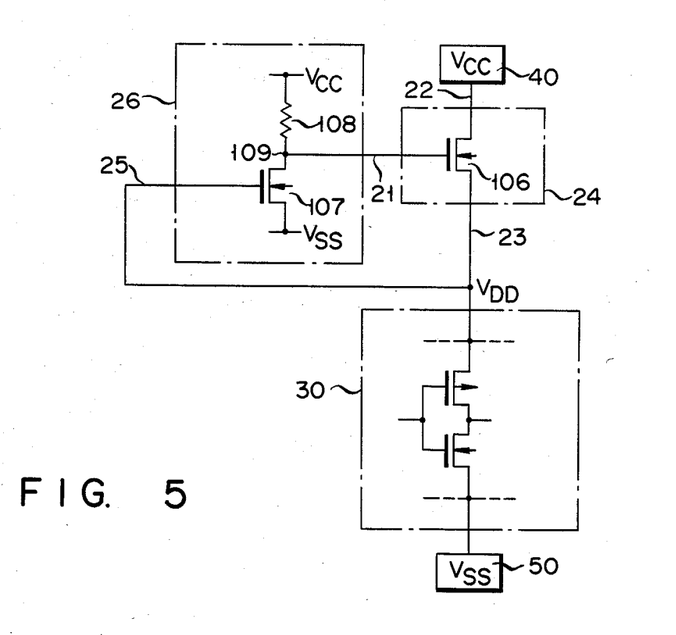
FIG. 5 is a circuit diagram of a modification of the FIG. 4 circuit.

In the internal power source circuit shown in FIG. 5, the voltage dropping circuit 24 is composed of an enhancement type N channel MOSFET 106. The MOSFET 106 is connected, at the drain, to the voltage input terminal 22; at the gate, to the control terminal 21, and at the source, to the voltage output terminal 23. The source voltage is supplied, as the internal power source voltage $V_{DD}$, to the internal circuit 30, as well as to the input terminal 25 of the voltage detecting circuit 26. The voltage detecting circuit 26 is composed of an inverter 109 containing an N channel MOSFET 107 and a load resistor 108. The internal power source voltage $V_{DD}$ is supplied to the gate of the MOSFET 107. In this embodiment, the N channel voltage dropping MOSFET is used in place of the P channel MOSFET 101 which is used in the FIG. 4 embodiment. Therefore, the on/off operation of the circuit to the signal at the control terminal 21 is inverted. For this reason, the voltage detecting circuit 26 is made up of a single stage of the inverter, although that of the FIG. 4 embodiment contains double stages of inverters. Of course, the MOSFET 106 may be of the depletion type.

Figure 6:
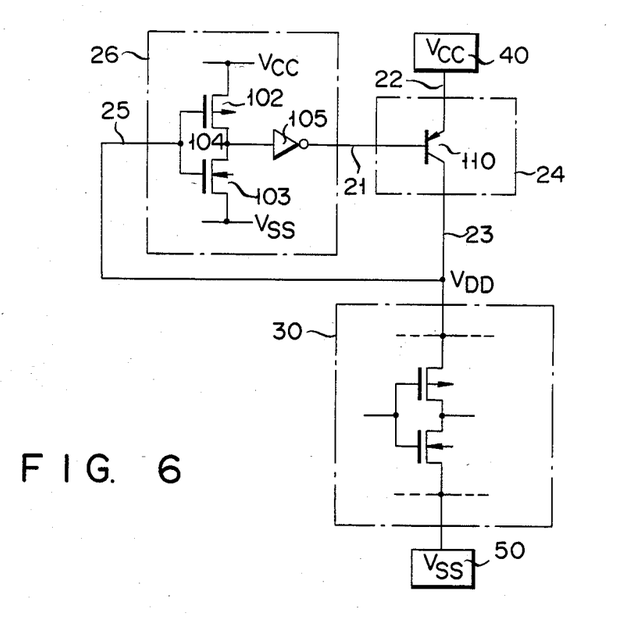
FIG. 6 is a circuit diagram of another modification of the FIG. 4 circuit.

FIG. 6 shows another practical example of the FIG. 3 arrangement. In the internal power source circuit shown in FIG. 6, a PNP bipolar transistor 110 is used as the voltage dropping circuit 24, in place of the P channel MOSFET 101 of FIG. 4. The transistor 110 is connected, at the emitter, to the voltage input terminal 22; at the base, to the control terminal 21, and, at the collector, to the voltage output terminal 23. The collector voltage is supplied, as the internal power source voltage $V_{DD}$, to the internal circuit 30, and to the input terminal 25 of the voltage detecting circuit 26. In this example, the voltage detecting circuit 26 is similar to the corresponding circuit of FIG. 4, in which a fixed and stable internal power source voltage $V_{DD}$ appears at the collector of the transistor 110, through an operation similar to that of FIG. 4.

Figure 7:
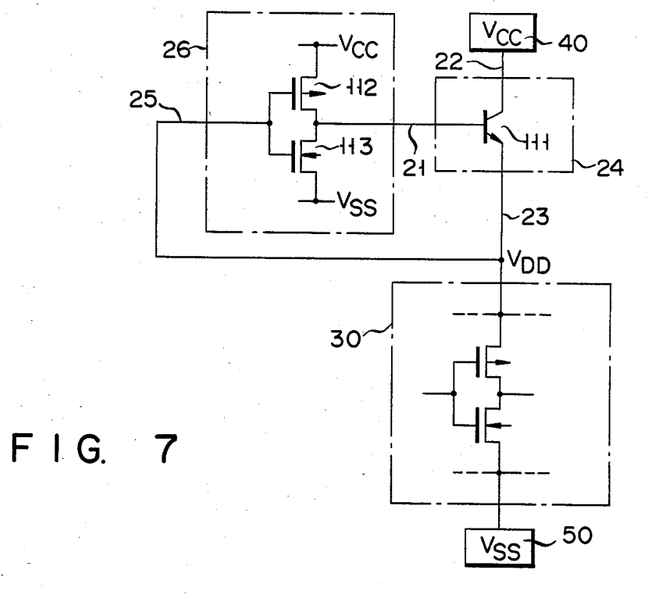
FIG. 7 is a circuit diagram of yet another embodiment of the FIG. 4 circuit.

FIG. 7 shows yet another practical arrangement of the configuration of FIG. 3. In the internal power source circuit shown in FIG. 7, an NPN bipolar transistor 111 is used as the voltage dropping circuit 24, whereas the voltage dropping circuit 24 of FIG. 5 consists of an N channel MOSFET 106. The transistor 111 is connected, at the collector, to the voltage input terminal 22; at the base, to the control terminal 21; and, at the emitter, to the voltage output terminal 23. The emitter voltage is applied, as the internal power source voltage $V_{DD}$, to the internal circuit 30 and to the input terminal 25 of the voltage detecting circuit 26. In this example, the voltage detecting circuit 26 consists of a single stage of the CMOS inverter 114 containing a P channel MOSFET 112 and an N channel MOSFET 113. The internal power source voltage $V_{DD}$ in question is obtained at the emitter of the transistor 111. In this example, a circuit arrangement similar to the voltage detecting circuit 26 of FIG. 5 may be employed; however, use of the CMOS inverter is preferable, to feed a larger base current to the bipolar transistor 111 and reduce the on-resistance of the transistor 111.

Figure 8:
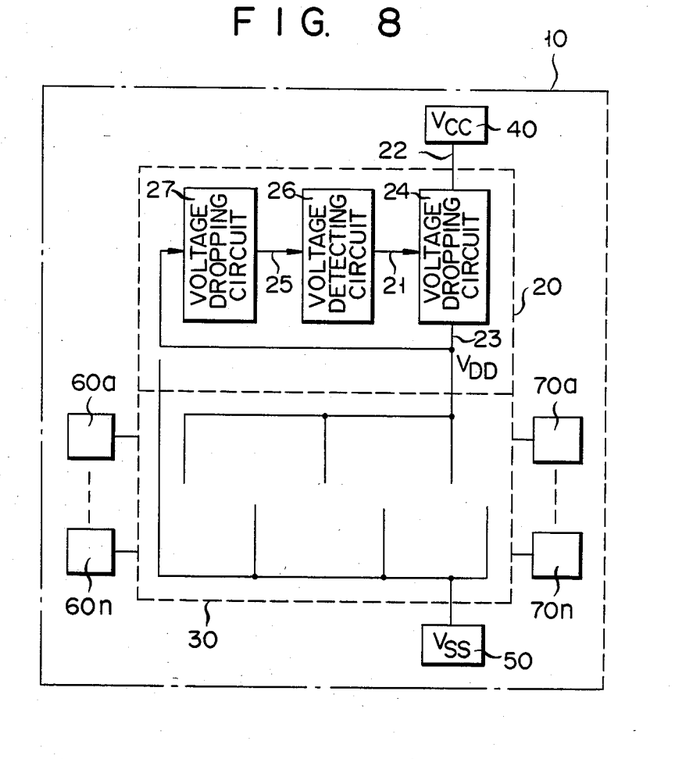
FIG. 8 is a block diagram of a MIS semiconductor integrated circuit according to another embodiment of the present invention.

A block diagram of a MIS semiconductor integrated circuit according to an embodiment of the present invention is shown in FIG. 8. This embodiment is different from the FIG. 3 embodiment, in that another voltage dropping circuit 27 (for dropping the internal power source voltage $V_{DD}$ to a fixed voltage) is provided between the voltage output terminal 23 of the voltage dropping circuit 24 and the input terminal 25 of the voltage detecting circuit 26.

In this embodiment, the internal power source voltage $V_{DD}$ is so controlled as to be equal to the sum of the threshold voltage $V_{TH}$ of the voltage detecting circuit 26 and a voltage dropped $\Delta V$ by the voltage dropping circuit 27. Since two factors are used to determine the internal power source voltage $V_{DD}$ in this embodiment, the accuracy of voltage $V_{DD}$ control is improved.

Figure 9:
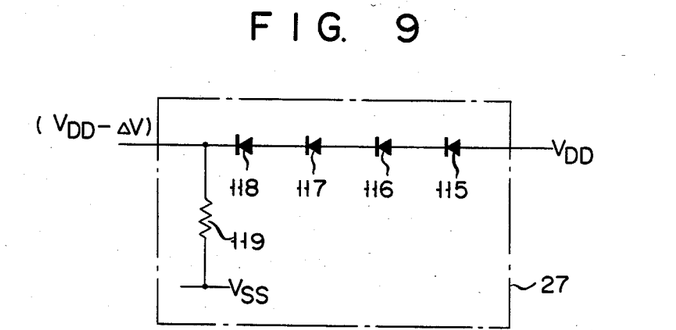
FIG. 9 illustrates the detailed circuitry of a portion of the FIG. 8 circuit.

FIG. 9 illustrates a practical arrangement of the voltage dropping circuit 27 used in the FIG. 8 embodiment. As shown, the voltage dropping circuit 27 is composed of four series-connected diodes 115 to 118, and a resistor for feeding a current to those diodes. These diodes are used in dropping the voltage $V_{DD}$ applied to the anode of the diode group by $\Delta V$ ($=4\ V_F$). Accordingly, voltage ($V_{DD}-\Delta V$) is obtained at the cathode of the diode group. Voltage $V_F$ is the total forward voltage of the diodes 115 to 118.

Figure 10:
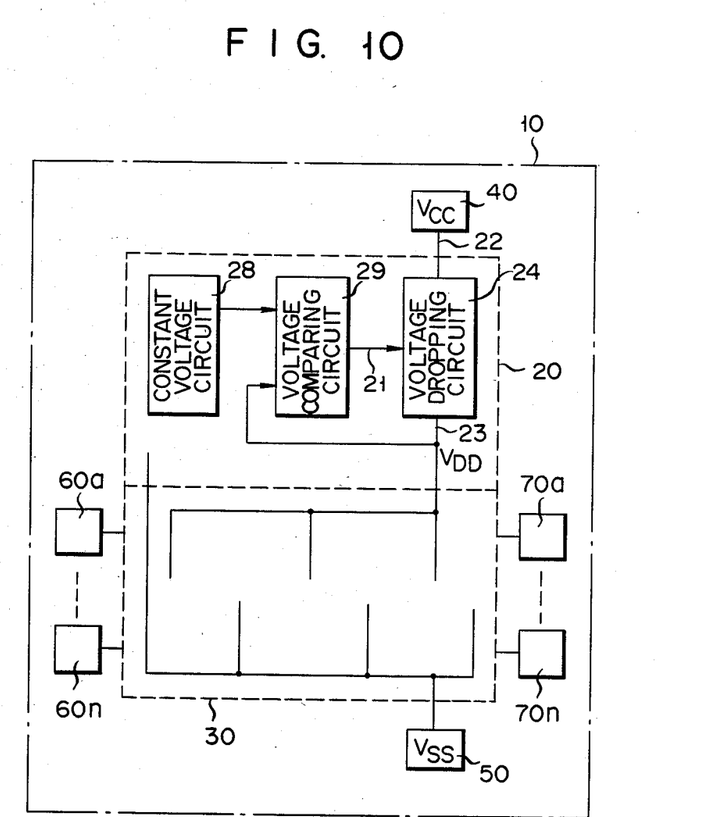
FIG. 10 is a block diagram of a MIS semiconductor integrated circuit according to yet another embodiment of the present invention.

FIG. 10 is a block diagram of a MIS semiconductor integrated circuit according to another embodiment of the present invention. As recalled, the FIG. 3 embodiment detects the voltage $V_{DD}$ at the predetermined threshold voltage $V_{TH}$ as set up in the voltage detecting circuit 26. The present embodiment employs a constant voltage circuit 28 and a voltage comparing circuit 29 to detect the internal power source voltage $V_{DD}$. The internal power source voltage $V_{DD}$ obtained in the voltage dropping circuit 24 is applied to the internal circuit 30 and to the voltage comparing circuit 29. The constant voltage circuit 28 forms a constant voltage, using the voltage $V_{CC}$ supplied to the power source voltage terminal 40. The constant voltage so obtained is applied to the voltage comparing circuit 29. In this embodiment, the fixed voltage $V_{DD}$ is obtained in such a manner that the output voltage of the voltage comparing circuit 29 is supplied to the control terminal 21 of the voltage dropping circuit 24.

Figure 11:
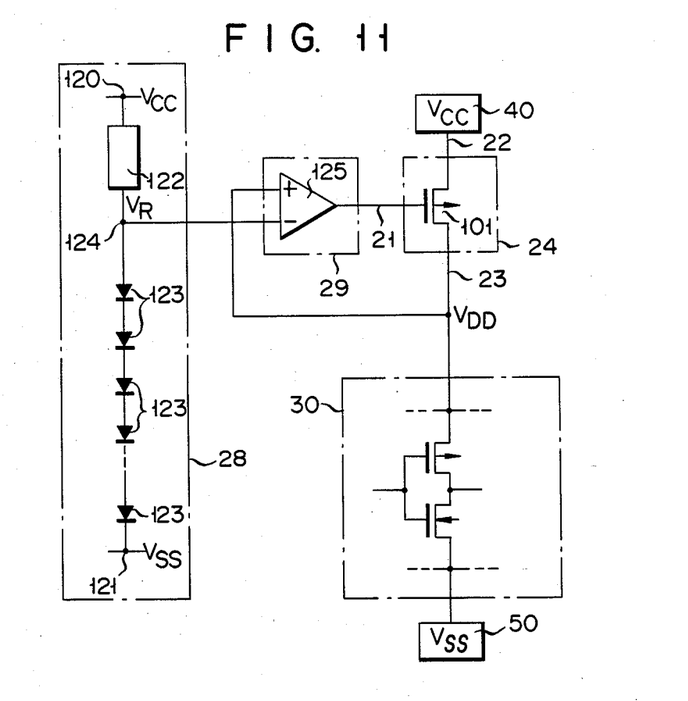
FIG. 11 is a circuit diagram of an embodiment of the FIG. 10 circuit.

FIG. 11 shows a practical arrangement of the configuration of FIG. 10. As shown, the constant voltage circuit 28 consists of a load element 122 between a $V_{CC}$ supply node 120 and a $V_{SS}$ supply node 121, and a group of series-connected diodes 123. A fixed voltage $V_R$ appears at a node 124 between the load element 122 and the diode group. In this case, the number n of diodes in the constant voltage circuit 28 is so selected as to produce a fixed voltage $V_R$, of e.g., 3 V, which is smaller than the magnitude (3.8 eV) of the potential barrier $\phi h$ shown in FIG. 2. The voltage comparing circuit 29 is made up of a differential amplifier 125 with inverting and noninverting input terminals, and an output terminal. The voltage dropping circuit 24, like the FIG. 4 embodiment is made up of an enhancement type P channel MOSFET 101.

Figure 12:
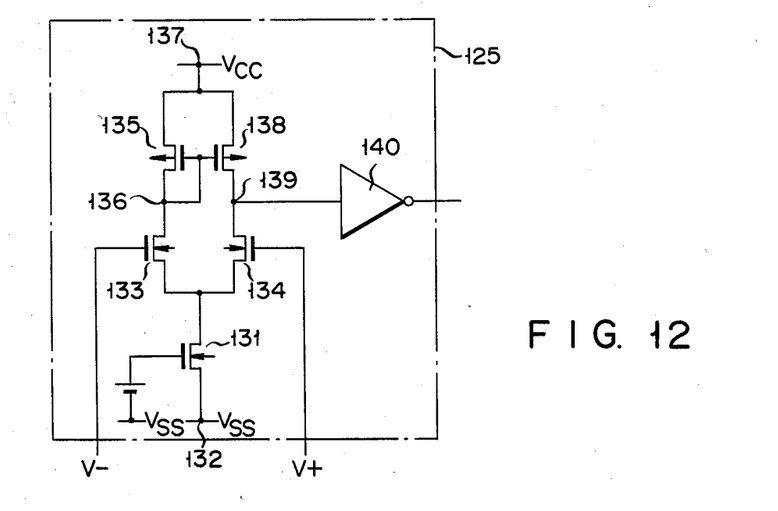
FIG. 12 shows a practical arrangement of a portion of the circuit of FIG. 11.

The differential amplifier 125 may consist of a known MOS type circuit, as shown in FIG. 12. As illustrated in FIG. 12, an N channel MOSFET 131, serving as a constant current source, is connected at the source to a node 132 to which the voltage $V_{SS}$ is applied, and is supplied at the gate with a constant voltage. An N channel MOSFET 133, which is used for input, has a gate which serves as the inverting input terminal. Another N channel MOSFET 134, which is also used for input, has a gate which serves as the noninverting input terminal. The sources of MOSFETs 133 and 134 are connected to a drain of MOSFET 131. A P channel MOSFET 135 is used as the load. The drain and gate of this MOSFET 135 are interconnected. A node 136 between the drain and gate of the MOSFET 135 is connected to the drain of transistor 133. The source of the MOSFET 135 is connected to the node 137. Another load P channel MOSFET 138 is connected, at the gate, to the gate of MOSFET 135; at the drain, to the drain of MOSFET 134; and, at the source, to the node 137. A CMOS inverter 140 is connected, at the input terminal, to a node 139 on the common drain of MOSFETs 134 and 138. In the differential amplifier 125 thus arranged, when the gate input voltage V+ of MOSFET 134 is lower than the gate input voltage V− of MOSFET 133, the output terminal (i.e., the output terminal of the CMOS inverter 140) is low in level. On the other hand, when the gate input voltage V+ of MOSFET 134 is higher than the gate input voltage V− of MOSFET 133, the output terminal is high in (i.e., is at the $V_{CC}$ level). A fixed voltage $V_R$ is applied as the gate input voltage V− of MOSFET 133. The internal power source voltage $V_{DD}$ is used as the gate input voltage V+ of MOSFET 134.

In the FIG. 11 circuit, when the internal power source voltage $V_{DD}$ applied to the differential amplifier 125 is lower than the constant voltage $V_R$, the output of the differential amplifier 125 is low, so that the P channel MOSFET 101 for voltage dropping is turned on. Accordingly, in this case, the internal power source voltage $V_{DD}$ gradually rises, as in the circuit of FIG. 4. When this voltage $V_{DD}$ is above voltage $V_R$, the output of the differential amplifier 125 is high and MOSFET 101 is turned off. Thus, the voltage $V_{DD}$ gradually drops, as in the FIG. 4 circuit. Through this operation, the P channel MOSFET 101 is switch-controlled, so that the internal power source voltage $V_{DD}$ is so controlled as to be a constant voltage $V_R$. Said constant voltage $V_R$ is invariable against a variation of the $V_{CC}$. As may be seen from the results of our experiment, the internal power sources voltage $V_{DD}$ is not changed against a change from 3 to 8 V of the $V_{CC}$, and a fixed voltage of 3 V can be obtained from voltage $V_{CC}$. Further, the internal circuit 30 driven by such a stable fixed voltage $V_{DD}$ is fully protected from the effects of a high voltage, such as a spike voltage, and is also protected from the effects of noise.

Figure 13:
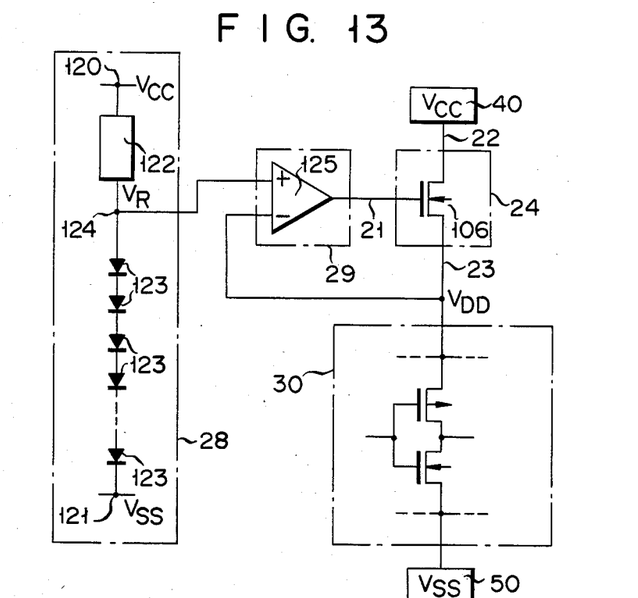
FIG. 13 is a circuit diagram of a modification of the FIG. 11 circuit.

FIG. 13 shows a modification of the FIG. 11 circuit. In this circuit, the voltage dropping circuit 24 is composed of an N channel MOSFET 106, as in the case of the FIG. 5 circuit. For this reason, the differential amplifier 125 is so wired that the constant voltage $V_R$ is applied to the noninverting input terminal, and the internal power source voltage $V_{DD}$, is applied to the inverting input terminal. In this circuit, when voltage $V_{DD}$ is lower than the constant voltage $V_R$, the output of the differential amplifier 125 is high, and MOSFET 106 is turned on. This results in an increase in the level of the $V_{DD}$. When voltage $V_{DD}$ is higher than the constant voltage $V_R$, the output of the differential amplifier 125 is low and the MOSFET 106 is cut off. In this way, a fixed and stable internal power source voltage $V_{DD}$ is obtained.

Figure 14:
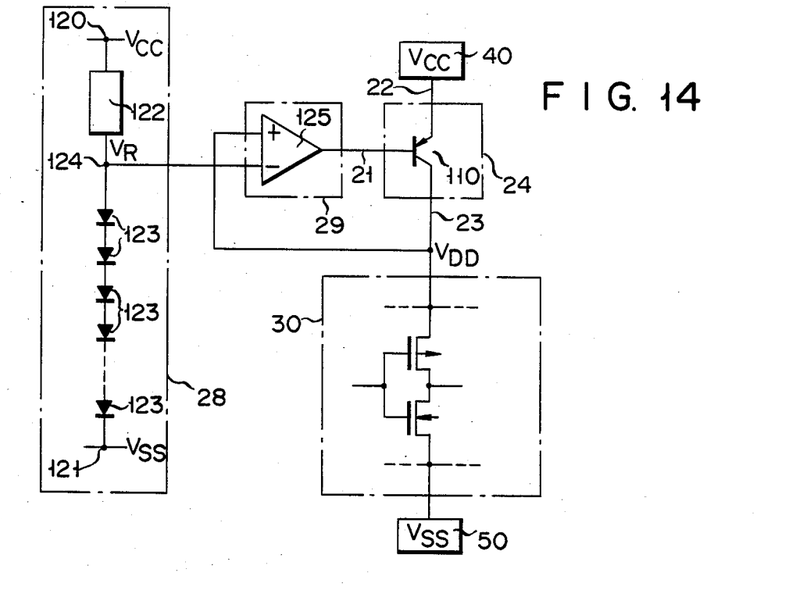
FIG. 14 is a circuit diagram of another modification of the FIG. 11 circuit.

FIG. 14 shows another modification of the FIG. 11 circuit. The voltage dropping circuit 24 is composed of a PNP bipolar transistor 110, as in the case of the FIG. 6 circuit. The rest of the circuit arrangement is the same as the corresponding arrangement of FIG. 11. A fixed and stable voltage $V_{DD}$ appears at the collector of transistor 110.

Figure 15:
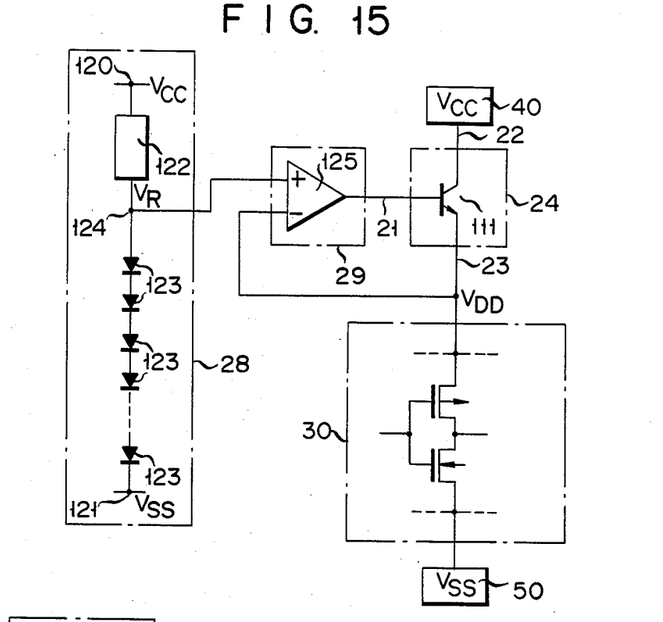
FIG. 15 is a circuit diagram of yet another embodiment of the FIG. 11 circuit.

FIG. 15 shows yet another modification of the FIG. 11 circuit. In this modification, the voltage dropping circuit 24 is made up of an NPN bipolar transistor 111, as in the case of FIG. 7. The rest of the circuit arrangement is the same as that of FIG. 13. A fixed and stable voltage $V_{DD}$ appears at the emitter of transistor 111, through an operation similar to that of the FIG. 11 circuit.

Figure 16:
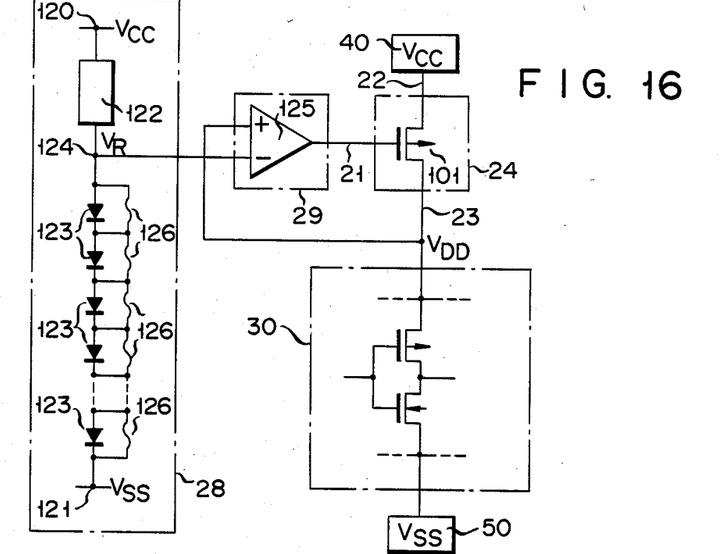
FIG. 16 is a circuit diagram of a further modification of the FIG. 11 circuit.

The constant voltage circuit 28 is shown in FIG. 10. The n diodes 123 are connected in series, as shown in FIG. 11, to thereby provide the fixed voltage $V_R$. This voltage $V_R$ may be represented as $n \cdot V_F$, where $V_F$ is the forward voltage of each diode. The internal power source voltage $V_{DD}$ is so controlled as to be equal to the $n \cdot V_F$ voltage ($V_R$). The forward voltages $V_F$ of the diodes have potentially different values for the various fabricating processes of the diodes. If the forward voltage $V_F$ changes, the internal power source voltage $V_{DD}$ cannot keep its constancy. To cope with this problem;

in the FIG. 16 circuit, which is another modification of the FIG. 11 circuit, the n fuses 126 are connected in parallel to their respective n diodes 123. With this arrangement, if the forward voltages $V_F$ of the diodes have a variation in their values during their manufacturing process, such a variation may be corrected by cutting the required number of fuses 126, to thereby sustain the consistancy of voltage $V_R$. The operational voltage of the internal circuit 30 made up of MOSFETs differs, both as a result of its manufacturing process and its performance. The fuses 126 may be cut by a laser, for example, to be adapted to the operating voltage of the internal circuit 30. In the FIG. 16 circuit, the P channel MOSFET 101 is used as the voltage dropping circuit 24. This MOSFET 101 may be replaced by the N channel MOSFET 106 (FIG. 13) or the bipolar transistor (FIGS. 14 and 15). This method, wherein the fuses 126 are used and selectively cut at the programming stage, may be replaced by another method, wherein the parallel circuits (in which the fuses are located as in the former method) are set in a high impedance state at the initial stage, and are selectively set in a low impedance state at the programming stage.

Figure 17:
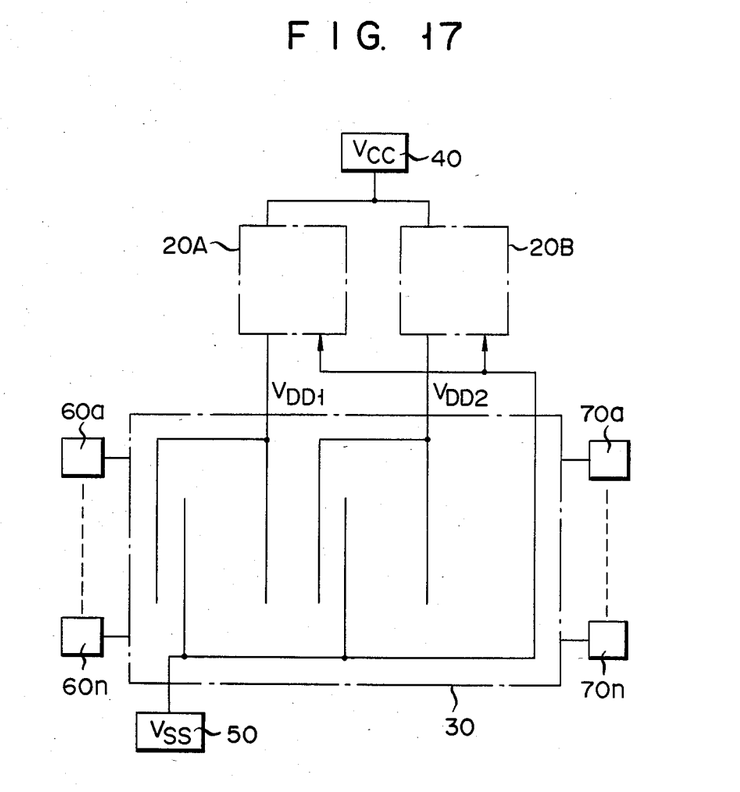
FIG. 17 is a block diagram of a MIS semiconductor integrated circuit according to a further embodiment of the present invention.

FIG. 17 is a block diagram of a MIS semiconductor integrated circuit according to a further embodiment of the present invention. In this embodiment, two internal power source circuits 20A, 20B with different voltges $V_{DD1}$, $V_{DD2}$ are provided for use in driving the different portions of the internal circuit 30. One of the different voltages is set at a low value, to conserve on power consumption; while the other is set at a high value, to quicken the operating speed of the circuit.

As may be seen from the foregoing, according to the present invention, the voltage-dropped and fixed voltage, e.g., a voltage of 3 V, with a high current feeding potential, can be obtained in an on-chip manner against a substantial variation of, e.g., from 3 to 8 V. Under this voltage-dropped and fixed internal voltage, an internal circuit 30 containing MOSFETs with an effective channel length of 1 $\mu$m or less operates. Therefore, the constraints on a power source voltage of from 1 to 5 V above, resulting from the further microfabrication of the MOSFETs, can be eliminated, to thereby provide MIS semiconductor integrated circuits free of the deterioration caused by the various circuit functions. The internal circuit 30 is thus operable under a fixed and stable internal power source voltage $V_{DD}$, even if the externally supplied power source voltage $V_{CC}$ is varied. Therefore, performance factors of the internal circuit 30, such as operating speed and power dissipation are stable against variations of the externally supplied power source voltage $V_{CC}$. Additionally, the internal circuit 30 is also stable against the effects of a spike voltage and/or noise. Accordingly, an integrated circuit containing MOSFETs with an effective channel length of 1 $\mu$m or less can be operated by using the conventional the 5 V power source voltage as a standard power source. Further, the circuit according to the present invention is compatible with the TTL circuit. Moreover, low-voltage integrated circuits to be realized in the future might be driven by, e.g., a 3 V power source, while sustaining the same performance level as if driven by a 5 V power source.

While, in the above embodiments, the voltage dropping circuit 24 consists of a single MOSFET or bipolar transistor, a plurality of such transistors might also be used, in a parallel connection or a cascade connection. Moreover, the 3 V level of the internal power source voltage $V_{DD}$ might be reduced to 2 V or 1 V, upon a reduction of the effective channel length (0.5 $\mu$m, 0.1 $\mu$m) of the MOSFET used.

What is claimed is:

1. An MIS semiconductor integrated circuit comprising:
   (a) a power source voltage terminal externally supplied with a power voltage;
   (b) voltage dropping means, having a control terminal, a voltage input terminal connected to said power source voltage terminal to receive said power voltage and a voltage output terminal, for controllably dropping said power voltage and supplying said dropped power voltage to said voltage output terminal as a function of an input control signal supplied to said control terminal;
   (c) voltage detection means, including a MISFET having a gate, for comparing said dropped power voltage at said voltage output terminal of said voltage dropping means to a prescribed threshold voltage level by inputting said dropped power voltage to said gate of said MISFET and for supplying a signal corresponding to the result of said comparison to said control terminal of said voltage dropping means as said input control signal; and
   (d) an internal circuit including a CMOS inverter having a p channel and an n channel MISFET, with channel regions of said p channel and n channel MISFETs connected in series, said p channel and n channel MISFETs having a common gate and with an output obtained from a common node of said MISFETs and with said dropped power voltage from said voltage output terminal of said voltage dropping means being supplied to one end of said series connected channel regions.

2. An MIS semiconductor integrated circuit according to claim 1, wherein said voltage detection means includes a CMOS inverter having a second p channel and a second n channel MISFET, with the channel regions of said second p channel and second n channel MISFETs connected in series and with said second p channel and n second channel MISFETs having a common gate to which said dropped voltage from said voltage output terminal of said voltage dropping means is supplied.

3. An MIS semiconductor integrated circuit according to claim 1, wherein said voltage detection means includes an inverter comprising one MISFET and a load resistance, said one MISFET having a gate to which said dropped voltage at said voltage output terminal of said voltage dropping means is supplied.

4. An MIS semiconductor integrated circuit according to claim 1, wherein said voltage detection means includes a source of constant voltage and a differential amplifier having a pair of input MISFETs which each have a gate, with said dropped voltage from said voltage output terminal of said voltage dropping means being supplied to one of said gates of said input MISFETs and said constant voltage being supplied to the other of said gates of said input MISFETs.

5. A MIS semiconductor integrated circuit according to claim 4, in which said voltage dropping means is a switching element.

6. A MIS semiconductor integrated circuit according to claim 5, in which said switching element is a MISFET.

7. A MIS semiconductor integrated circuit according to claim 5, in which said switching element is a bipolar transistor.

8. An MIS semiconductor integrated circuit according to claim 4, wherein said voltage detection means includes a CMOS inverter having a second pair of MISFETs, one being n channel and one being p channel, with the channel regions of said second pair of MISFETs connected in series, and with said second pair of MISFETs having a common gate to which the output of said differential amplifier is supplied.

9. An MIS semiconductor integrate circuit according to claim 4, wherein said voltage detection means includes an inverter comprising one MISFET and a load resistance, said one MISFET having a gate to which the output of said differential amplifier is supplied.

10. A MIS semiconductor integrated circuit according to claim 4, in which said source of constant voltage comprises a plurality of series-connected diodes.

11. A MIS semiconductor integrated circuit according to claim 10, in which programmable fuses are connected in parallel to said diodes.

12. A MIS semiconductor integrated circuit according to claim 4, in which the effective channel length of said MISFETs contained in said internal circuit is 1 $\mu$m or less.

13. A MIS semiconductor integrated circuit according to claim 1, in which said voltage dropping means is a switching element.

14. A MIS semiconductor integrated circuit according to claim 13, in which said switching element is a MISFET.

15. A MIS semiconductor integrated circuit according to claim 13, in which said switching element is a bipolar transistor.

16. A MIS semiconductor integrated circuit according to claim 1, in which the effective channel length of said MISFETs contained in said internal circuit is 1 $\mu$m or less.

* * * * *

REEXAMINATION CERTIFICATE (4207th)

United States Patent [19]
Uchida

[11] B1 4,585,955
[45] Certificate Issued Nov. 21, 2000

[54] INTERNALLY REGULATED POWER VOLTAGE CIRCUIT FOR MIS SEMICONDUCTOR INTEGRATED CIRCUIT

[75] Inventor: Yukimasa Uchida, Yokohama, Japan

[73] Assignee: Tokyo Shibaura Denki Kabushiki Kaisha, Kawasaki, Japan

Reexamination Request:
No. 90/004,746, Sep. 11, 1997

Reexamination Certificate for:
Patent No.: 4,585,955
Issued: Apr. 29, 1986
Appl. No.: 06/556,686
Filed: Nov. 30, 1983

[30] Foreign Application Priority Data

Dec. 15, 1982 [JP] Japan ................................. 57-219617
Dec. 18, 1982 [JP] Japan ................................. 57-222452
Dec. 27, 1982 [JP] Japan ................................. 57-234046

[51] Int. Cl.[7] .............................. G05F 1/575; G05F 1/10
[52] U.S. Cl. ........................ 327/541; 327/566; 327/581; 323/316; 323/317; 323/281; 323/284; 365/226
[58] Field of Search .................................. 327/538, 540; 323/315, 316

[56] References Cited

U.S. PATENT DOCUMENTS

| | | | |
|---|---|---|---|
| 3,710,193 | 1/1973 | Greenberg et al. ...................... | 361/709 |
| 3,723,774 | 3/1973 | Rogers .................................... | 327/540 |
| 4,267,501 | 5/1981 | Smith ...................................... | 323/313 |
| 4,358,728 | 11/1982 | Hashimoto .............................. | 323/275 |
| 4,428,040 | 1/1984 | Yamashiro et al. ...................... | 363/62 |
| 4,433,282 | 2/1984 | Squires .................................... | 323/281 |

FOREIGN PATENT DOCUMENTS 0 063 483 A2  10/1982  European Pat. Off. .

OTHER PUBLICATIONS

Patent Abstracts of Japan, vol. 7, No. 233 (E–204)(1378), Oct. 15, 1983 of Japanese Patent 58–121664.

N. N. Wang, Low Voltage Reference Generating Circuit, IBM Technical Disclosure Bulletin, vol. 22, No. 8A (Jan. 1980).

R. S. Becker, Voltage Reference Circuit, IBM Technical Disclosure Bulletin, vol. 23, No. 5 (Oct. 1980).

*Primary Examiner*—Terry D. Cunningham

[57] ABSTRACT

A MIS semiconductor integrated circuit is one which contains an internal circuit. In the internal circuit, an externally supplied power source voltage supplied to a power source voltage terminal is supplied to the voltage input terminal of a voltage dropping circuit. The voltage at a voltage output terminal of the voltage dropping circuit is detected by a voltage detecting circuit containing an inverting circuit with a predetermined threshold voltage. The voltage dropping circuit is switch-controlled by applying the detected voltage to the control terminal thereof. The voltage output terminal of the voltage dropping circuit provides an internal power source voltage which is formed by dropping the externally supplied power source voltage. An internal circuit containing MOSFETs with an effective channel length of 1 $\mu$m or less is driven by the internal power source voltage.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3–6, 8–14 and 16 are cancelled.

Claims 2, 7 and 15 are determined to be patentable as amended.

New claims 17 and 18 are added and determined to be patentable.

2. An MIS semiconductor integrated circuit [according to claim 1,] *comprising:*
   (*a*) *a power source voltage terminal externally supplied with a power voltage;*
   (*b*) *voltage dropping means, having a control terminal, a voltage input terminal connected to said power source voltage terminal to receive said power voltage and a voltage output terminal, for controllably dropping said power voltage and supplying said dropped power voltage to said voltage output terminal as a function of an input control signal supplied to said control terminal;*
   (*c*) *voltage detection means, including a MISFET having a gate, for comparing said dropped power voltage at said voltage output terminal of said voltage dropping means to a prescribed threshold voltage level by inputting said dropped power voltage to said gate of said MISFET and for supplying a signal corresponding to the result of said comparison to said control terminal of said voltage dropping means as said input control signal; and*
   (*d*) *an internal circuit including a CMOS inverter having a p channel and an n channel MISFET, with channel regions of said p channel and n channel MISFETs connected in series, said p channel and n channel MISFETs having a common gate and with an output obtained from a common node of said MISFETs and with said dropped power voltage from said voltage output terminal of said voltage dropping means being supplied to one end of said series connected channel regions,*
   wherein said voltage detection means includes a CMOS inverter having a second p channel and a second n channel MISFET, with the channel regions of said second p channel and second n channel MISFETs connected in series and with said second p channel and n second channel MISFETs having a common gate to which said dropped voltage from said voltage output terminal of said voltage dropping means is supplied.

7. [A] *An* MIS semiconductor integrated circuit [according to claim 5,] *comprising:*
   (*a*) *a power source voltage terminal externally supplied with a power voltage;*
   (*b*) *voltage dropping means, having a control terminal, a voltage input terminal connected to said power source voltage terminal to receive said power voltage and a voltage output terminal, for controllably dropping said power voltage and supplying said dropped power voltage to said voltage output terminal as a function of an input control signal supplied to said control terminal;*
   (*c*) *voltage detection means, including a MISFET having a gate, for comparing said dropped power voltage at said voltage output terminal of said voltage dropping means to a prescribed threshold voltage level by inputting said dropped power voltage to said gate of said MISFET and for supplying a signal corresponding to the result of said comparison to said control terminal of said voltage dropping means as said input control signal; and*
   (*d*) *an internal circuit including a CMOS inverter having a p channel and an n channel MISFET, with channel regions of said p channel and n channel MISFETs connected in series, said p channel and n channel MISFETs having a common gate and with an output obtained from a common node of said MISFETs and with said dropped power voltage from said voltage output terminal of said voltage dropping means being supplied to one end of said series connected channel regions,*
   *wherein said voltage detection means includes a source of constant voltage and a differential amplifier having a pair of input MISFETs which each have a gate, with said dropped voltage from said voltage output terminal of said voltage dropping means being supplied to one of said gates of said input MISFETs and said constant voltage being supplied to the other of said gates of said input MISFETs,*
   *wherein said voltage dropping means is a switching element; and*
   [in which] *wherein* said switching element is a bipolar transistor.

15. [A] *An* MIS semiconductor integrated circuit [according to claim 13,] *comprising:*
    (*a*) *a power source voltage terminal externally supplied with a power voltage;*
    (*b*) *voltage dropping means, having a control terminal, a voltage input terminal connected to said power source voltage terminal to receive said power voltage and a voltage output terminal, for controllably dropping said power voltage and supplying said dropped power voltage to said voltage output terminal as a function of an input control signal supplied to said control terminal;*
    (*c*) *voltage detection means, including a MISFET having a gate, for comparing said dropped power voltage at said voltage output terminal of said voltage dropping means to a prescribed threshold voltage level by inputting said dropped power voltage to said gate of said MISFET and for supplying a signal corresponding to the result of said comparison to said control terminal of said voltage dropping means as said input control signal; and*
    (*d*) *an internal circuit including a CMOS inverter having a p channel and an n channel MISFET, with channel regions of said p channel and n channel MISFETs connected in series, said p channel and n channel MISFETs having a common gate and with an output obtained from a common node of said MISFETs and with said dropped power voltage from said voltage output terminal of said voltage dropping means being supplied to one end of said series connected channel regions,* wherein said voltage dropping means is a switching element, and

[in which] *wherein* said switching element is a bipolar transistor.

17. An MIS semiconductor integrated circuit comprising:

(a) a power source voltage terminal externally supplied with a power voltage;

(b) voltage dropping means, having a control terminal, a voltage input terminal connected to said power source voltage terminal to receive said power voltage and a voltage output terminal, for controllably dropping said power voltage and supplying said dropped power voltage to said voltage output terminal as a function of an input control signal supplied to said control terminal;

(c) voltage detection means, for comparing said dropped power voltage at said voltage output terminal of said voltage dropping means to a prescribed threshold voltage level and for supplying a signal corresponding to the result of said comparison to said control terminal of said voltage dropping means as said input control signal;

(d) an internal circuit including a CMOS inverter having a p channel and an n channel MISFET, with channel regions of said p channel and n channel MISFETs connected in series, said p channel and n channel MISFETs having a common gate and with an output obtained from a common node of said MISFETs and with said dropped power voltage from said voltage output terminal of said voltage dropping means being supplied to one end of said series connected channel regions, and (e) an additional voltage dropping means connected between the voltage output terminal of the voltage dropping means and the voltage detection means for providing a different dropped power voltage, the level of which is different than the dropped power voltage, wherein said voltage detection means includes a source of constant voltage and a differential amplifier having a pair of input MISFETs which each have a gate, with said dropped voltage from said voltage output terminal of said voltage dropping means being supplied to one of said gates of said input MISFETs and said constant voltage being supplied to the other of said gates of said input MISFETs, wherein said differential amplifier has a pair of load MISFETs of a first conductivity type connected to the pair of input MISFETs, wherein said voltage dropping means is a MISFET of the first conductivity type, and wherein said power source voltage terminal, said voltage dropping means, said voltage detection means, and said internal circuit are integrally formed on a single substrate, and wherein the internal circuit is one of a memory circuit, a portion of the memory circuit, a microprocessor circuit, a digital signal processing circuit, and a gate array circuit.

18. An MIS semiconductor integrated circuit comprising:

(a) a power source voltage terminal externally supplied with a power voltage;

(b) voltage dropping means, having a control terminal, a voltage input terminal connected to said power source voltage terminal to receive said power voltage and a voltage output terminal, for controllably dropping said power voltage and supplying said dropped power voltage to said voltage output terminal as a function of an input control signal supplied to said control terminal;

(c) voltage detection means, for comparing said dropped power voltage at said voltage output terminal of said voltage dropping means to a prescribed threshold voltage level and for supplying a signal corresponding to the result of said comparison to said control terminal of said voltage dropping means as said input control signal; and (d) an internal circuit including a CMOS inverter having a p channel and an n channel MISFET, with channel regions of said p channel and n channel MISFETs connected in series, said p channel and n channel MISFETs having a common gate and with an output obtained from a common node of said MISFETs and with said dropped power voltage from said voltage output terminal of said voltage dropping means being supplied to one end of said series connected channel regions, and (e) an additional voltage dropping means connected between the voltage output terminal of the voltage dropping means and the voltage detection means for providing a different dropped power voltage, the level of which is different than the dropped power voltage, wherein said voltage detection means includes a source of constant voltage and a differential amplifier having a pair of input MISFETs which each have a gate, with said dropped voltage from said voltage output terminal of said voltage dropping means being supplied to one of said gates of said input MISFETs and said constant voltage being supplied to the other of said gates of said input MISFETs, wherein said power voltage is positive voltage and the dropped power voltage is also positive voltage, and wherein said voltage dropping means is a MISFET of a p-channel type, and wherein said power source voltage terminal, said voltage dropping means, said voltage detection means, and said internal circuit are integrally formed on a single substrate, and wherein the internal circuit is one of a memory circuit, a portion of the memory circuit, a microprocessor circuit, a digital signal processing circuit, and a gate array circuit.

* * * * *